United States Patent
Kang

(10) Patent No.: US 9,324,561 B2
(45) Date of Patent: Apr. 26, 2016

(54) SILICON CARBIDE EPITAXIAL WAFER, AND PREPARATION METHOD THEREOF

(71) Applicant: LG INNOTEK CO., LTD., Seoul (KR)

(72) Inventor: Seok Min Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/404,374

(22) PCT Filed: May 28, 2013

(86) PCT No.: PCT/KR2013/004645
§ 371 (c)(1),
(2) Date: Nov. 26, 2014

(87) PCT Pub. No.: WO2013/180433
PCT Pub. Date: Dec. 5, 2013

(65) Prior Publication Data
US 2015/0108493 A1    Apr. 23, 2015

(30) Foreign Application Priority Data
May 31, 2012 (KR) .......... 10-2012-0058855

(51) Int. Cl.
| | |
|---|---|
| *H01L 29/15* | (2006.01) |
| *H01L 21/02* | (2006.01) |
| *C30B 25/02* | (2006.01) |
| *C30B 29/36* | (2006.01) |
| *H01L 29/16* | (2006.01) |

(52) U.S. Cl.
CPC .......... *H01L 21/02529* (2013.01); *C30B 25/02* (2013.01); *C30B 29/36* (2013.01); *H01L 21/0262* (2013.01); *H01L 21/02378* (2013.01); *H01L 21/02447* (2013.01); *H01L 29/1608* (2013.01)

(58) Field of Classification Search
CPC ................................................ H01L 21/02529
USPC .......................................................... 257/76
See application file for complete search history.

(56) References Cited

U.S. PATENT DOCUMENTS

2013/0040103 A1    2/2013   Asamura et al.

FOREIGN PATENT DOCUMENTS

| JP | 2008-004888 A | 1/2008 |
| JP | 2009-256138 A | 11/2009 |
| JP | 2011-225421 A | 11/2011 |
| JP | 2012-051795 A | 3/2012 |
| KR | 10-2009-0017074 A | 2/2009 |

OTHER PUBLICATIONS

Search Report for International Application No. PCT/KR2013/004645.

*Primary Examiner* — Anthony Ho
(74) *Attorney, Agent, or Firm* — LRK Patent Law Firm

(57) ABSTRACT

According to an embodiment, there is provided a method of fabricating an epitaxial wafer, which includes preparing a wafer in a susceptor; and growing an epitaxial layer on the wafer, wherein the growing of the epitaxial layer on the wafer includes supplying a raw material into the susceptor; growing the epitaxial layer on the wafer at a first growth rate; and growing the epitaxial layer on the wafer at a second growth rate higher than the first growth rate. According to an embodiment, there is provided a silicon carbide epitaxial wafer which includes a silicon carbide wafer; and a silicon carbide epitaxial layer on the silicon carbide wafer wherein a surface defect formed on the silicon carbide epitaxial layer is 1 ea/cm$^2$ or less.

10 Claims, 3 Drawing Sheets

```
┌─────────────────────────────────────────┐
│  Step of preparing wafer in susceptor   │──ST10
└─────────────────────────────────────────┘
                    │
                    ▼
┌─────────────────────────────────────────┐
│  Step of growing silicon carbide epitaxial │──ST20
│           layer on wafer                │
└─────────────────────────────────────────┘
```

SILICON CARBIDE EPITAXIAL WAFER, AND PREPARATION METHOD THEREOF

TECHNICAL FIELD

The embodiment relates to a silicon carbide epitaxial wafer and a method of fabricating the same.

BACKGROUND ART

In general, among technologies to form various thin films on a substrate or a wafer, a CVD (Chemical Vapor Deposition) scheme has been extensively used. The CVD scheme results in a chemical reaction. According to the CVD scheme, a semiconductor thin film or an insulating layer is formed on a wafer surface by using the chemical reaction of a source material.

The CVD scheme and the CVD device have been spotlighted as an important thin film forming technology due to the fineness of the semiconductor device and the development of high-power and high-efficiency LED. Recently, the CVD scheme has been used to deposit various thin films, such as a silicon layer, an oxide layer, a silicon nitride layer, a silicon oxynitride layer, or a tungsten layer, on a wafer.

For example, to deposit a silicon carbide thin film on a substrate or a wafer, a reactive raw material capable of reacting with the wafer needs to be introduced. According to the related art, a silicon carbide epitaxial layer is deposited by introducing silane ($SiH_4$) and ethylene ($C_2H_4$) serving as a standard precursor or methyltrichlorosilane (MTS) as a raw material, heating the raw material to produce an intermediate compound such as $CH_3$ or $SiCl_x$, and introducing the intermediate compound to react the intermediate compound with a wafer disposed in a susceptor.

However, when the epitaxial layer is deposited on the silicon carbide, a defect or surface roughness may be caused on the wafer. The defect or surface roughness of the wafer may degrade the quality of the silicon carbide epitaxial wafer.

Thus, a silicon carbide epitaxial wafer capable of overcoming the defect or surface roughness of the wafer and a method of fabricating the same are required.

DISCLOSURE

Technical Problem

The embodiment provides a method of fabricating a silicon carbide epitaxial wafer which can fabricate a high-quality silicon carbide epitaxial wafer by reducing a surface defect and surface roughness of the silicon carbide epitaxial wafer and a silicon carbide epitaxial wafer fabricated by the same.

Technical Solution

According to an embodiment, there is provided a method of fabricating an epitaxial wafer, which includes preparing a wafer in a susceptor; and growing an epitaxial layer on the wafer, wherein the growing of the epitaxial layer on the wafer includes supplying a raw material including carbon, silicon and chlorine into the susceptor; growing the epitaxial layer on the wafer at a first growth rate; and growing the epitaxial layer on the wafer at a second growth rate higher than the first growth rate.

According to an embodiment, there is provided a silicon carbide epitaxial wafer which includes a silicon carbide wafer; and a silicon carbide epitaxial layer on the silicon carbide wafer wherein a surface defect formed on the silicon carbide epitaxial layer is 1 ea/$cm^2$ or less.

Advantageous Effects

According to the method of fabricating a silicon carbide epitaxial wafer of an embodiment, in the process of depositing a silicon carbide epitaxial layer, the silicon carbide epitaxial layer is deposited while varying the growth rate as to a first growth rate and a second growth rate higher than the first growth rate.

In the step of growing an epitaxial layer at the first growth rate, a surface defect existing on the wafer may be reduced. In general, a defect called a micropipe having a micro size (μm) exists on the silicon carbide wafer. Since such a defect causes a defect on the silicon carbide epitaxial layer when the silicon carbide epitaxial layer is grown on the wafer, the quality of the final silicon carbide epitaxial wafer is deteriorated and the efficiency of a power device is deteriorated if such a silicon carbide epitaxial layer is applied to the power device.

According to the method of fabricating a silicon carbide epitaxial wafer of an embodiment, the growth rate is set as to the first and second growth rates. After the micropipe existing on the wafer is removed at the first growth rate, the silicon carbide epitaxial layer is deposited at the second growth rate, so that the micropipe existing on the final silicon carbide epitaxial wafer may be reduced.

Therefore, the micropipe existing on the silicon carbide epitaxial wafer may be reduced by 99% or more, so that the silicon carbide epitaxial wafer may be used as a high-quality and high-efficiency electronic device.

DESCRIPTION OF DRAWINGS

FIGS. 3 to 5 are views of a susceptor in order to illustrate a method of fabricating a silicon carbide epitaxial wafer according to an embodiment, wherein FIG. 3 is an exploded perspective view of a deposition apparatus according to an embodiment, FIG. 4 is a perspective view of the deposition apparatus, and FIG. 5 is a sectional view taken along line I-I' of FIG. 4.

BEST MODE

Mode for Invention

Figure 1:
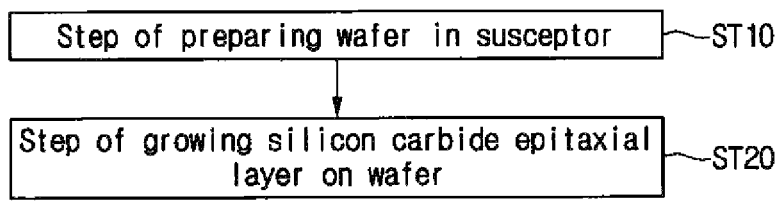
FIGS. 1 and 2 are flowcharts illustrating a method of fabricating a silicon carbide epitaxial wafer according to an embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each a layer (or film), each region, each pattern, or each structure shown in the drawings may be exaggerated, omitted or schematically drawn for the purpose of convenience or clarity. In addition, the size of elements does not utterly reflect an actual size.

Hereinafter, a method of fabricating a silicon carbide epitaxial wafer according to an embodiment will be described with reference to FIGS. 1 to 4.

Figure 2:
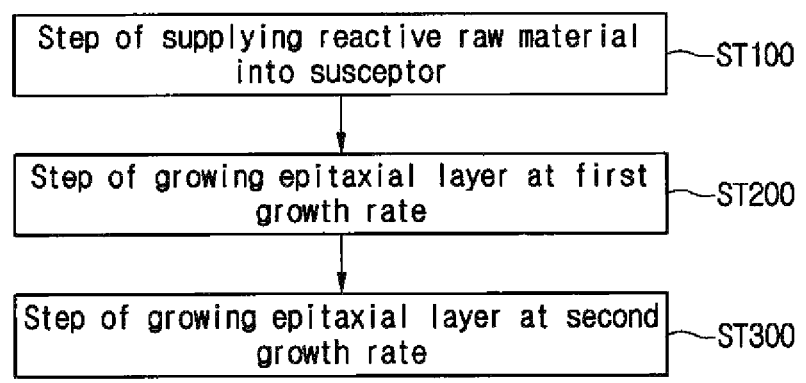
Figure 3:
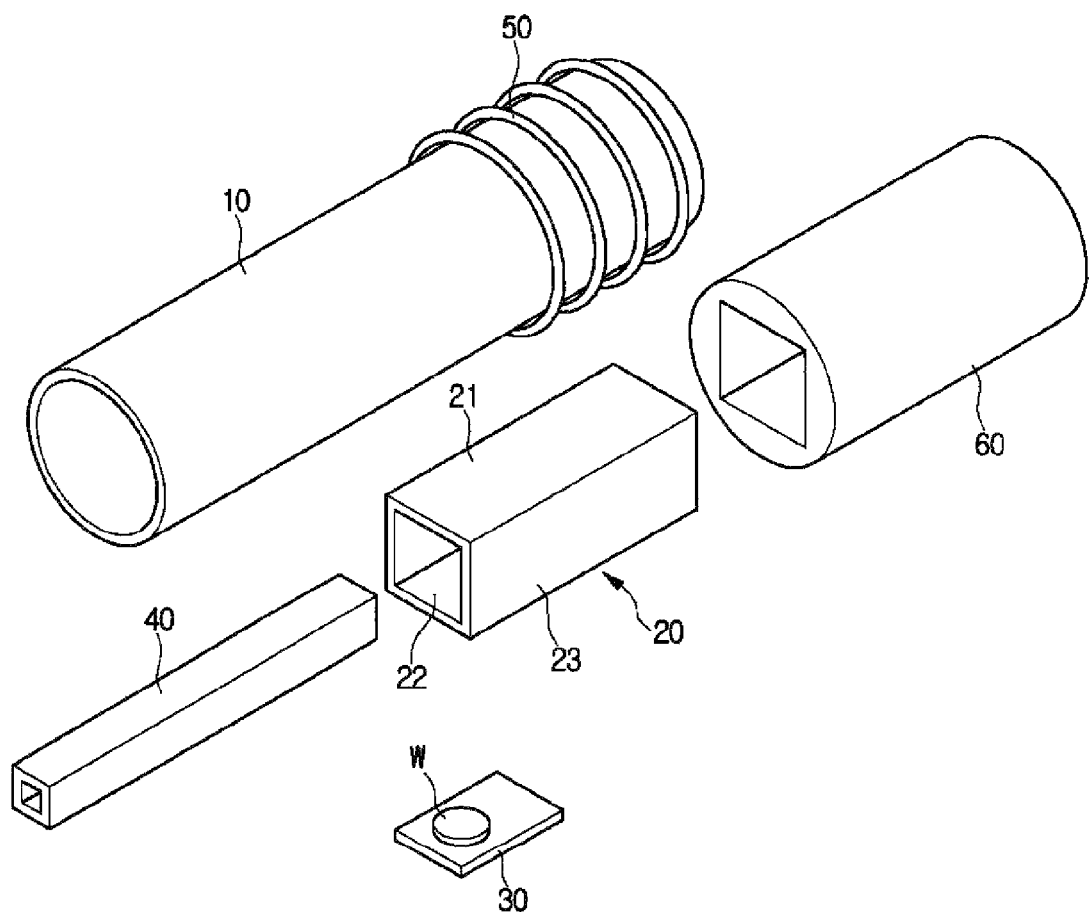
Figure 4:
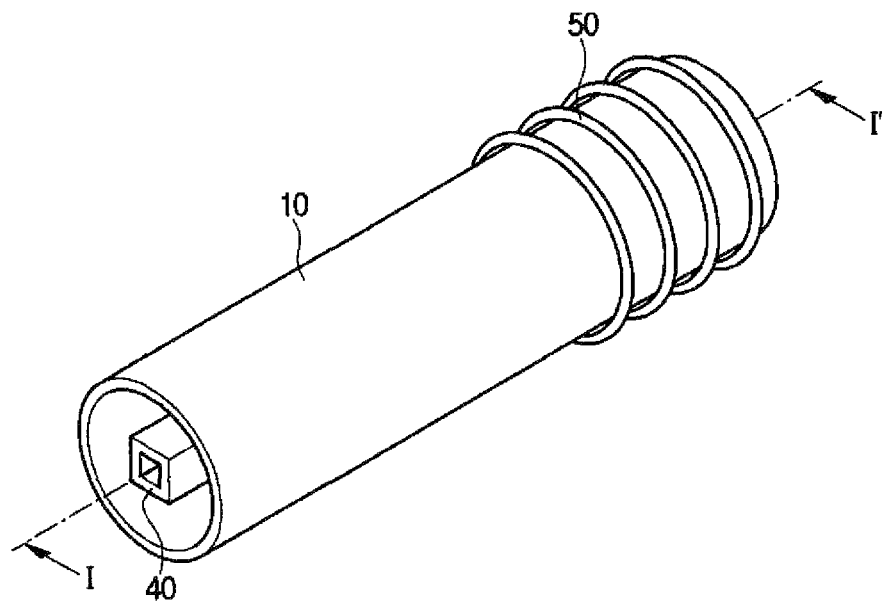
Figure 5:
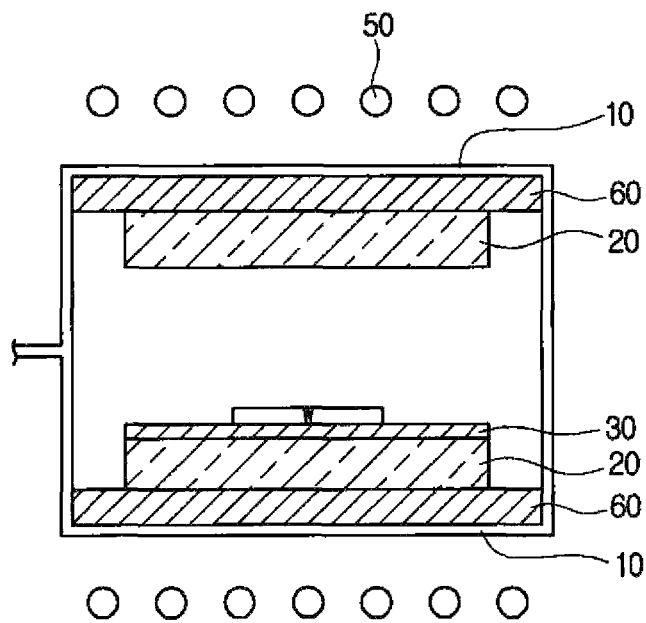

FIGS. 1 and 2 are flowcharts illustrating a method of fabricating a silicon carbide epitaxial wafer according to an embodiment. FIGS. 3 to 5 are an exploded perspective view, a perspective view and a sectional view of a susceptor in order to illustrate a method of fabricating a silicon carbide epitaxial wafer according to an embodiment.

Referring to FIG. 1, a method of fabricating a silicon carbide epitaxial wafer according to an embodiment includes a step ST10 of preparing a wafer in a susceptor; and a step ST20 of growing a silicon carbide epitaxial layer on the wafer.

In the step ST10 of preparing a wafer in a susceptor, the wafer may be placed in the susceptor located in a chamber. That is, the method of fabricating the silicon carbide epitaxial wafer according to the embodiment may be a method of fabricating the silicon carbide epitaxial wafer.

Then, in the step ST20 of growing a silicon carbide epitaxial layer on the wafer, a raw material is supplied into the susceptor such that the silicon carbide epitaxial layer may be grown on the wafer.

In addition, referring to FIG. 2, the step ST20 of growing a silicon carbide epitaxial layer on the wafer includes a step ST100 of supplying a reactive raw material into the susceptor; a step ST200 of growing an epitaxial layer on the wafer at a first growth rate; and a step ST300 of growing an epitaxial layer on the wafer at a second growth rate.

In the step ST100 of supplying a reactive raw material in the susceptor, the reactive raw material including carbon, silicon and chlorine is supplied into the susceptor. In detail, the reactive raw material may include a liquid raw material, a vapor raw material or a solid raw material including carbon and silicon. The liquid raw material may include methyltrichlorosilane (MTS) or trichlorosilane (TCS). In addition, the vapor raw material may include $SiH_4$, $C_2H_4$ and HCl, or $SiH_4$, $C_3H_8$ and HCl. The vapor raw material may further include $H_2$ as carrier gas.

The first growth rate may be different from the second growth rate. Preferably, the second growth rate may be higher than the first growth rate. In addition, the step ST200 of growing an epitaxial layer on the wafer at the first growth rate and the step ST300 of growing an epitaxial layer on the wafer at the second growth rate higher than the first growth rate may be sequentially performed.

The first growth rate may be about 10 μm/h or more. Preferably, the first growth rate may be about 10 μm/h to about 20 μm/h.

In addition, the second growth rate may be higher than the first growth rate. In detail, the second growth rate may be about 30 μm/h. That is, the second growth rate may be higher than the first growth rate by about 10 μm/h or more.

The first and second growth rates may be controlled according to amounts of raw materials supplied into the susceptor, each ratio between atoms, and temperature and pressure in the susceptor.

The method of fabricating a silicon carbide epitaxial wafer according to an embodiment may change the first and second growth rates by controlling the amount of a raw material supplied into the susceptor. In detail, in the step ST200 of growing the epitaxial layer on the wafer at the first growth rate, the amount of the reactive raw material supplied into the susceptor may be reduced. In the step ST300 of growing the epitaxial layer on the wafer at the second growth, rate, the amount of the reactive raw material supplied into the susceptor may be increased. That is, in the step ST300 of growing the epitaxial layer on the wafer at the second growth rate, the amount of the reactive raw material supplied into the susceptor may be greater than that in the step ST200 of growing the epitaxial layer on the wafer at the first growth rate.

In addition, in the step ST200 of growing the epitaxial layer on the wafer at the first growth rate, the ratios between atoms included in the reactive raw material is controlled. That is, when the susceptor is heated after the raw material is supplied into the susceptor, the raw material is ionized into the intermediate compound including carbon (C), silicon (Si) and hydrogen (H). In this case, in the step of growing an epitaxial layer at the first growth rate, the ratio of the number of carbon atoms to the number of silicon atoms (C/Si ratio) may be 0.7 to 1.5 and the percentage of the silicon atoms to the hydrogen molecules ($Si/H_2$) may be 0.01% or more.

In the step ST200 of growing an epitaxial layer at the first growth rate, the surface defect existing on the wafer may be reduced. In general, a defect called a micropipe having a micro size (μm) exists on the silicon carbide wafer. Since such a defect causes a defect on the silicon carbide epitaxial layer when the silicon carbide epitaxial layer is grown on the wafer, the quality of the final silicon carbide epitaxial wafer is deteriorated and the efficiency of a power device is deteriorated if the silicon carbide epitaxial layer is applied to the power device.

Thus, according to the method of fabricating a silicon carbide epitaxial wafer of an embodiment, a growth rate is set as to the first and second growth rates. After the micropipe existing on the wafer is removed at the first growth rate, the silicon carbide epitaxial layer is deposited at the second growth rate, so that the micropipe existing on the final silicon carbide epitaxial wafer may be reduced. Preferably, the micropipe existing on the silicon carbide epitaxial wafer may be reduced by 99% or more. Therefore, the surface defects of the silicon carbide epitaxial wafer, which is finally fabricated according to the method of fabricating a silicon carbide epitaxial wafer of an embodiment, are reduced, so that a high quality of a silicon carbide epitaxial wafer may be fabricated.

In the step ST300 of growing an epitaxial layer on the wafer at the second growth rate, after the micropipe existing on the wafer is removed, the silicon carbide epitaxial layer may be deposited on the wafer.

In the step of depositing the silicon carbide epitaxial layer on the wafer, the silicon carbide epitaxial layer may be deposited on the wafer through a deposition apparatus including a susceptor.

FIGS. 3 to 5 are an exploded perspective view, a perspective view and a section view illustrating a method of fabricating a silicon carbide epitaxial wafer according to an embodiment.

Referring to FIGS. 3 to 5, the deposition apparatus includes a chamber 10, a susceptor 20, a source gas line 40, a wafer holder 30, and an induction coil 50.

The chamber 10 may has a cylindrical tube shape. Meanwhile, the chamber 10 may have a rectangular box shape. The chamber 10 may receive the susceptor 20, the source gas line 40 and the wafer holder 30.

Both ends of the chamber 10 may be sealed, and the chamber 10 may prevent external gas from being introduced into the chamber 10 to maintain a degree of vacuum. The chamber 10 may include quartz representing superior mechanical strength and superior chemical durability. The chamber 10 may have improved heat resistance.

In addition, an adiabatic part 60 may be further provided in the chamber 10. The adiabatic part 60 may preserve heat in the chamber 10. A material constituting the adiabatic part 60 may include nitride ceramic, carbide ceramic, or graphite.

The susceptor 20 is disposed in the chamber 10. The susceptor 20 receives the source gas line 40 and the wafer holder 30. The susceptor 20 receives a substrate such as the wafer W.

In addition, the reactive gas is introduced into the susceptor 20 through the source gas line 40.

As shown in FIG. 3, the susceptor 20 may include a susceptor upper plate 21, a susceptor lower plate 22, and susceptor lateral plates 23. In addition, the susceptor upper and lower plates 21 and 22 face each other.

The susceptor 20 may be manufactured by placing the susceptor upper and lower plates 21 and 22, placing the susceptor lateral plates 23 at both sides of the susceptor upper and lower plates 21 and 22, and bonding the susceptor upper and lower plates 21 and 22 with the susceptor lateral plates 23.

However, the embodiment is not limited to the above. For instance, a space for a gas passage may be formed in the rectangular parallelepiped susceptor 20.

The susceptor 20 may include graphite representing a high heat resistance property and a superior workability, so that the susceptor 20 can endure under the high temperature condition. Further, the susceptor 20 may have a structure in which a graphite body is coated with silicon carbide. Meanwhile, the susceptor 20 may be induction-heated.

The reactive raw material supplied to the susceptor 20 is decomposed into an intermediate compound by heat, and then the intermediate compound may be deposited on the wafer W. For example, the reactive raw material may include a liquid, gaseous or solid raw material including carbon, silicon and chlorine. The liquid raw material may include methyltrichlorosilane (MTS) or trichlorosilane (TCS). The gaseous raw material may include silane ($SiH_4$), ethylene ($C_2H_4$) and hydrogen chloride, or silane ($SiH_4$), propane ($C_3H_8$) and hydrogen chloride (HCl). In addition, the gaseous raw material may further include hydrogen ($H_2$) as carrier gas.

The reactive raw material may be decomposed into radical including silicon, carbon and chlorine, and a silicon carbide epitaxial layer may be grown on the wafer W. In more detail, the radical may include $CH_x$.($1 \leq x < 4$) or $SiCl_x$.($1 \leq x < 4$) having $CH_3$., $SiCl$., $SiCl_2$., $SiHCl$., or $SiHCl_2$.

The source gas line 40 may have a rectangular tube shape. For example, a material constituting the source gas line 40 may include quartz.

The wafer holder 30 is disposed in the susceptor 20. In detail, the wafer holder 30 may be disposed at a rear portion of the susceptor 20 based on a flow direction of source gas. The wafer holder 30 supports the wafer W. For example, a material used for the wafer holder 30 may include silicon carbide or graphite.

The induction coil 50 is disposed at an outer side of the chamber 10. In detail, the induction coil 50 may surround an outer peripheral surface of the chamber 10. The induction coil 50 may induction-heat the susceptor 20 through electromagnetic induction. The induction coil 50 may be wound around the outer peripheral surface of the chamber 10.

The susceptor 20 may be heated at a temperature in the range of about 1500° C. to about 1700° C. As described above, during a time period at which the temperature is increased in the range of about 1500° C. to about 1575° C., a surface of the wafer can be modified to a carbon-rich state by introducing the first etching gas and/or the second etching gas.

As described above, an apparatus for growing a silicon carbide epitaxial layer according to the embodiment may form a thin film such as the silicon carbide epitaxial layer on a substrate such as the wafer W, and discharge remaining gas to the outside through a discharge line which is disposed at an end of the susceptor 20.

As described above, according to the method of fabricating a silicon carbide epitaxial wafer of an embodiment, the silicon carbide epitaxial layer is grown on the wafer while changing the growth rate. That is, the silicon carbide epitaxial layer is deposited on the wafer at the first growth rate and the second growth rate higher than the first growth rate. In this case, in the step of growing a silicon carbide epitaxial layer at the first growth rate, the surface defect existing on the wafer may be reduced.

That is, a defect called a micropipe having a micro size (μm) exists on the silicon carbide wafer. Since such a defect causes a defect on the silicon carbide epitaxial layer when the silicon carbide epitaxial layer is grown on the wafer, the quality of the final silicon carbide epitaxial wafer is deteriorated and the efficiency of a power device is deteriorated if the silicon carbide epitaxial layer is applied to the power device.

Therefore, according to the method of fabricating a silicon carbide epitaxial wafer of an embodiment, the growth rate is set as to the first and second growth rates. After the micropipe existing on the wafer is removed at the first growth rate, the silicon carbide epitaxial layer is deposited on the wafer where the micropipe is removed at the second growth rate, so that the micropipe existing on the final silicon carbide epitaxial wafer may be reduced. Therefore, according to the method of fabricating a silicon carbide epitaxial wafer of an embodiment, the surface defects of a silicon carbide epitaxial wafer can be reduced, so that a high-quality silicon carbide epitaxial wafer may be fabricated.

That is, the method of fabricating an epitaxial wafer according to an embodiment may fabricate a silicon carbide epitaxial wafer which includes a wafer and a silicon carbide epitaxial layer formed on the wafer, wherein a surface defect including the micropipe formed on the silicon carbide epitaxial layer is 1 ea/$cm^2$ or less.

Hereinafter, methods of fabricating a silicon carbide epitaxial wafer according to embodiments and comparative examples will be described in detail. However, the embodiments and comparative examples are proposed for the purpose of detailed explanation and the embodiments and comparative examples are not limited to them.

Embodiment

After a silicon carbide wafer is disposed in the susceptor, silane, propane, hydrogen chloride and hydrogen were supplied into the susceptor as source gas. In this case, in the first step, reaction was carried out within 10 minutes at the temperature in the range of about 1570° C. to about 1650° C. and the growth rate of about 10 μm/h. At the second step, reaction was carried out at the temperature in the range of about 1500° C. to about 1700° C. and the growth rate of about 30 μm/h, thereby fabricating the silicon carbide epitaxial wafer having a silicon carbide epitaxial layer with a desired thickness.

In this case, at the growth rate of 10 μm/h, the ratio of the atomic number of carbon to the atomic number of silicon (C/Si ratio) was 0.7 to 1, and the percentage of the silicon atoms to hydrogen molecules ($Si/H_2$ ratio) was 0.01% or more.

Comparative Example

Except that the first step is not performed, the silicon carbide epitaxial wafer was fabricated through the same method as embodiment 1.

TABLE 1

| Classification | Micropipe (ea/$cm^2$) |
|---|---|
| Embodiment | less than 1 |
| Comparative example | beyond 1 |

Referring to Table 1, it can be understood that the surface defect of the silicon carbide epitaxial wafer according to the embodiment is less than that of the silicon carbide epitaxial wafer according to the comparative example. That is, according to the silicon carbide epitaxial wafer of the embodiment, the micropipe existing on the surface of the silicon carbide epitaxial wafer is less than 1 ea/cm$^2$. That is, the micropipe rarely exists.

That is, according to the method of fabricating a silicon carbide epitaxial wafer and the silicon carbide epitaxial wafer fabricated by the same of the embodiments, the micropipe existing on the wafer is reduced by varying the growth rate and then the epitaxial layer is grown on the wafer, so the micropipe rarely exists on the final silicon carbide epitaxial wafer, so that the silicon carbide epitaxial wafer may have a high quality and a high efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method of fabricating a silicon carbide epitaxial wafer, the method comprising:
   preparing a silicon carbide wafer in a susceptor; and
   growing a silicon carbide epitaxial layer on the silicon carbide wafer,
   wherein the growing of the silicon carbide epitaxial layer on the silicon carbide wafer comprises:
   supplying a raw material into the susceptor;
   growing the silicon carbide epitaxial layer on the silicon carbide wafer at a first growth rate; and
   growing the silicon carbide epitaxial layer on the silicon carbide wafer at a second growth rate higher than the first growth rate,
   wherein the raw material includes carbon, silicon and chlorine.

2. The method of claim 1, wherein the first growth rate is about 10 μm/h to about 20 μm/h.

3. The method of claim 2, wherein the second growth rate is about 30 μm/h.

4. A silicon carbide epitaxial wafer fabricated by the method of fabricating a silicon carbide epitaxial wafer according to claim 1,
   the silicon carbide epitaxial wafer comprising:
   a silicon carbide wafer; and
   a silicon carbide epitaxial layer on the silicon carbide wafer,
   wherein a surface defect formed on the silicon carbide epitaxial layer is 1 ea/cm$^2$ or less.

5. The silicon carbide epitaxial wafer of claim 4, wherein the surface defect includes a micropipe.

6. The method of claim 2, wherein, in the growing of the silicon carbide epitaxial layer at the first growth rate, a ratio of an atomic number of carbon to an atomic number of silicon is 0.7 to 1.5.

7. The method of claim 6, wherein, in the growing of the silicon carbide epitaxial layer at the first growth rate, a percentage of silicon atoms to hydrogen molecules is 0.01% or more.

8. The method of claim 1, wherein the growing of the silicon carbide epitaxial layer on the silicon carbide wafer comprises:
   supplying a reactive raw material into the susceptor to produce intermediate compound; and
   forming the silicon carbide epitaxial layer on the silicon carbide wafer through reaction between the reactive raw material and the silicon carbide wafer.

9. The method of claim 7, wherein the intermediate compound includes $CH_x.(1 \leq x < 4)$ or $SiCl_x.(1 \leq x < 4)$.

10. The method of claim 1, wherein the growing of the silicon carbide epitaxial layer at the first growth rate and the growing of the silicon carbide epitaxial layer at the second growth rate are sequentially performed.

* * * * *